(12) United States Patent
Huang et al.

(10) Patent No.: US 8,710,601 B2
(45) Date of Patent: Apr. 29, 2014

(54) MEMS STRUCTURE AND METHOD FOR MAKING THE SAME

(75) Inventors: Chien-Hsin Huang, Taichung (TW); Bang-Chiang Lan, Taipei (TW); Ming-I Wang, Taipei County (TW); Hui-Min Wu, Hsinchu County (TW); Tzung-I Su, Yun-Lin County (TW); Chao-An Su, Kaohsiung County (TW); Tzung-Han Tan, Taipei (TW); Min Chen, Taipei County (TW); Meng-Jia Lin, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 449 days.

(21) Appl. No.: 12/621,526

(22) Filed: Nov. 19, 2009

(65) Prior Publication Data

US 2011/0115039 A1    May 19, 2011

(51) Int. Cl.
*H01L 29/84* (2006.01)

(52) U.S. Cl.
USPC ............ 257/419; 257/E21.002; 257/E29.324; 438/53

(58) Field of Classification Search
USPC .............. 257/419, E21.002, E29.324; 438/53
See application file for complete search history.

(56) References Cited

U.S. PATENT DOCUMENTS

2008/0094686 A1    4/2008    U'Ren

OTHER PUBLICATIONS

Ken Okutani, Properties of Aluminum Films Deposited by Low Energy and High Density Ion Bias Sputtering Method Using Cusp Magnetic Field Electrode, Jun. 12-13, 1990 VMIC Conference IEEE.

*Primary Examiner* — Long Pham
(74) *Attorney, Agent, or Firm* — Winston Hsu; Scott Margo (57) ABSTRACT

A micro electro mechanical system (MEMS) structure is disclosed. The MEMS structure includes a backplate electrode and a 3D diaphragm electrode. The 3D diaphragm electrode has a composite structure so that a dielectric is disposed between two metal layers. The 3D diaphragm electrode is adjacent to the backplate electrode to form a variable capacitor together.

17 Claims, 7 Drawing Sheets

MEMS STRUCTURE AND METHOD FOR MAKING THE SAME

BACKGROUND OF THE INVENTION

1. Field of the Invention

The present invention generally relates to a MEMS structure and a method for making the same. In particular, the present invention relates to an MEMS structure with a 3D diaphragm electrode and a method for making the same. Such 3D diaphragm electrode has a composite structure to enhance the mechanical strength of the 3D diaphragm electrode per se.

2. Description of the Prior Art

MEMS devices include micro machines integrated with electronic micro circuits on substrates. Such devices may form, for example, microsensors or microactuators which operate based on, for example, electromagnetic, electrostrictive, thermoelectric, piezoelectric, or piezoresistive effects. MEMS devices have been formed on insulators or other substrates using micro-electronic techniques such as photolithography, vapor deposition, and etching . . . etc. Recently, MEMS is fabricated using the same types of steps (such as the deposition of layers of material and the selective removal of the layers of material) that are used to fabricate other conventional analog and digital complementary metal oxide semiconductor (CMOS) circuits. An MEMS microphone structure presently can be made from general micro electronic technology, such as photolithography, vapor phase deposition, etching or LIGA, performed on a substrate, such as an insulating layer or other semiconductor.

Figure 1:
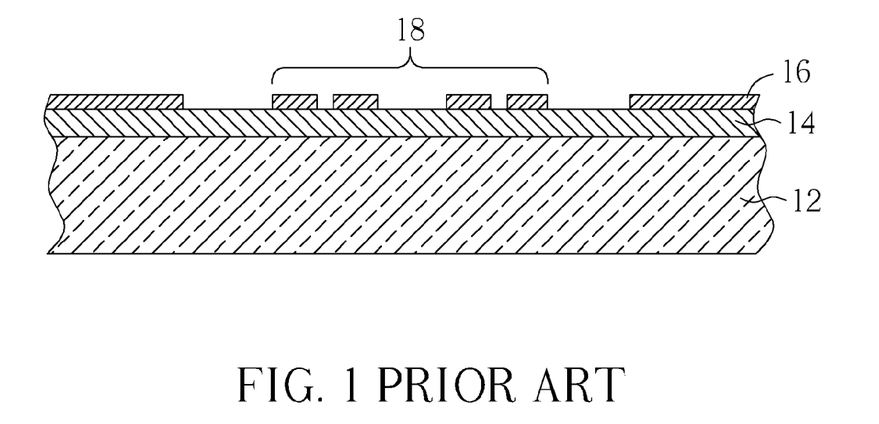
FIG. 1 through FIG. 3 are schematic diagrams illustrating a method of fabricating a MEMS microphone structure according to the prior art.
Figure 2:
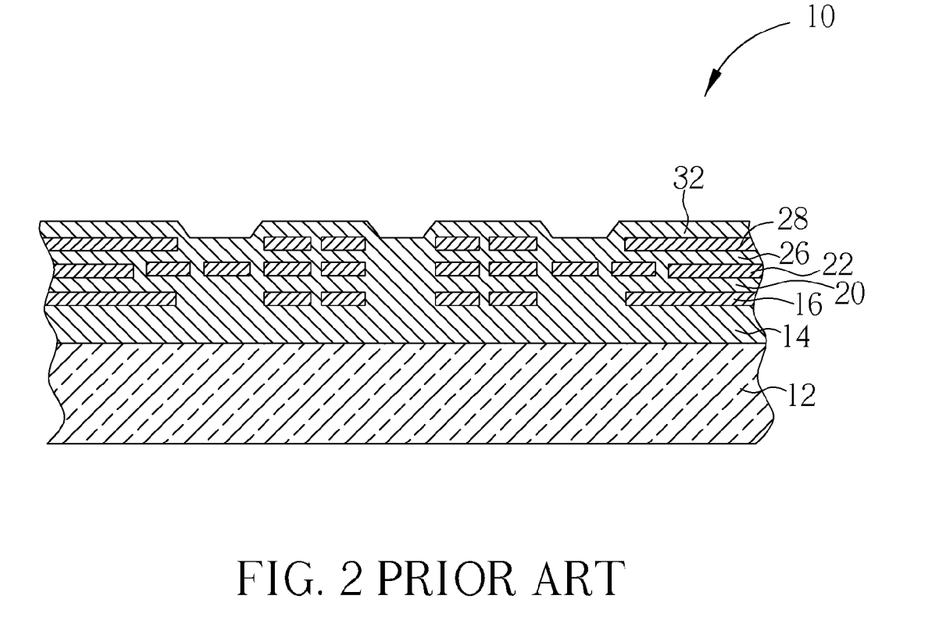
Figure 3:
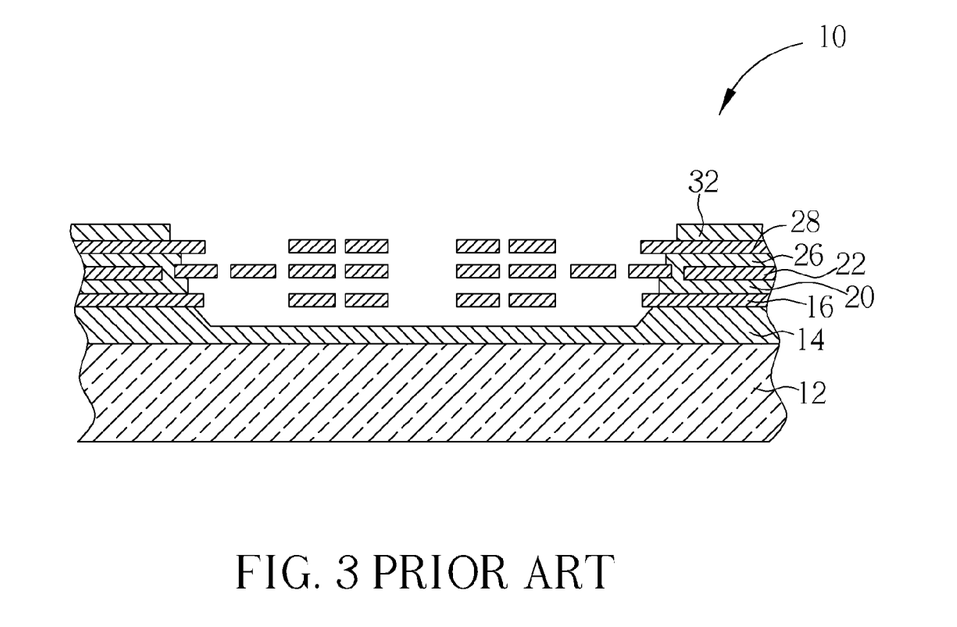

Referring to FIG. 1 through FIG. 3, FIG. 1 through FIG. 3 are schematic diagrams illustrating a method of fabricating a MEMS microphone structure according to the prior art. As shown in FIG. 1, the method of fabricating the MEMS microphone structure 10 with multi-metal layers according to the prior art is as follows. First, a substrate 12 is provided, and the surface of the substrate 12 has a base sacrificial layer 14 and a first metal layer 16. Then, the first metal layer 16 is patterned to form a first micro-machined metal mesh 18. Next, as shown in FIG. 2, a first sacrificial layer 20 is deposited to cover the substrate 12, and the surface of the first sacrificial layer 20 is planarized. Thereafter, a second metal layer 22 is formed on the first sacrificial layer 20, and then, a second metal layer 22 is patterned to form a second micro-machined metal mesh. Next, a second sacrificial layer 26 is deposited to cover the substrate 12, and the surface of the second sacrificial layer 26 is planarized. Then, a third metal layer 28 is formed on the second sacrificial layer 26, and then, the third metal layer 28 is patterned to form a third micro-machined metal mesh. Later, a third sacrificial layer 32 covers the substrate 12. Finally, as shown in FIG. 3, an isotropic dry etching process is utilized to remove the first sacrificial layer 20, the second sacrificial layer 26, the third sacrificial layer 32 and apart of the base sacrificial layer 14 among the first micro-machined metal mesh 18, second micro-machined metal mesh and third micro-machined metal mesh, so that the first micro-machined metal mesh 18, the second micro-machined metal mesh and the third micro-machined metal mesh are suspended above the substrate 12 so as to form a multilayer membrane. Afterwards, a back side etching process is performed to etch through the substrate 12 so as to allow free movement of air molecules and vibrate the multilayer membrane. Therefore, the MEMS microphone structure 10 according to the prior art is formed.

As described above, the conventional MEMS microphone structure uses a traditional Al process to form the micro-machined metal mesh according to the prior art, that is, the first metal layer, the second metal layer and the third metal layer composed of aluminum are respectively formed first, and then, a photoresist layer is coated thereon. Next, the photoresist layer is patterned, and then, the photoresist layer is used as a mask to etch the metal layers so as to form the micro-machined metal mesh. However, because the above-described method needs to etch multiple layers of metal, a novel micro electro mechanical system (MEMS) structure is still needed to possess a much more robust but simpler structure.

SUMMARY OF THE INVENTION

The present invention therefore proposes a micro electro mechanical system (MEMS) structure for uses as a microphone. The micro electro mechanical system structure of the present invention has a 3D diaphragm electrode of a composite structure. Such 3D diaphragm electrode of a composite structure not only has robust mechanical strength, but also in the manufacturing process, a step to etch a metal layer may be omitted to create a simpler process.

The MEMS structure of the present invention includes a backplate electrode and a 3D diaphragm electrode. The 3D diaphragm electrode is above the backplate electrode to form a variable capacitor together. The diaphragm electrode includes a first metal layer with at least a concave trench structure, at least a first spacer formed at the sidewall of the concave trench structure, and a second metal layer conformal formed on the surface of the first metal layer and the first spacer. The composite structure of the 3D diaphragm electrode enhances the mechanical strength of the 3D diaphragm electrode per se in order to be able to sufficiently cope with all kinds of compressive or the tensile stress caused by sound waves when the microphone is in use.

The present invention also proposes a method to form a micro electro mechanical system structure. First, a substrate having a tapered trench is provided. Second, a first material layer is formed to conformally cover the substrate. Then, a first etched step is performed to selectively remove part of the first material layer and to retain the first material layer disposed on a sidewall of the tapered trench to form a first spacer. Later, a first metal layer is formed to conformally cover the substrate and the first spacer. Next, a second material layer is formed to conformally cover the first metal layer. Afterwards, a second etched step is performed to remove part of the second material layer and to selectively retain the second material layer disposed adjacent to the sidewall of the tapered trench to form a second spacer. Thereafter, a second metal layer is formed to conformally cover the second spacer and the first metal layer to construct a 3D diaphragm electrode.

In the 3D diaphragm electrode of the present invention, a dielectric is selectively disposed between two metal layers to form a composite structure. The 3D diaphragm electrode of the composite structure not only deals with all kinds of compressive or the tensile stress caused by sound waves when the microphone is in use, but also the manufacturing process may involve no step to etch a metal layer so a simpler process is obtained, which are two advantageous features of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
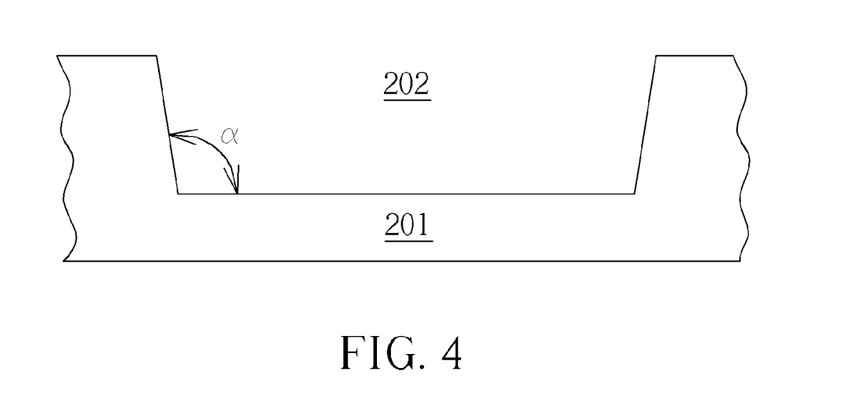
FIG. 4 through FIG. 12 are schematic diagrams illustrating the method to form a micro electro mechanical system structure according to the present invention.

The present invention first provides a method to form a micro electro mechanical system structure. FIG. 4 through FIG. 12 are schematic diagrams illustrating the method to form a micro electro mechanical system structure according to the present invention. As shown in FIG. 4, first a substrate 201 is provided in the method to form a micro electro mechanical system structure according to the present invention. The substrate 201 may be a material which contains Si, such as single crystal Si, poly Si, silicon oxide or the combination thereof. Using a semiconductor material may make the method of the present invention compatible with the current semiconductor process. This is another feature of the method of present invention. The substrate 201 includes a trench 202. When the trench 202 is formed, a suitable etching method may be used, so that the trench 202 has a tapered sidewall, i.e. the bottom and the sidewall of the trench 202 have an angle α greater than 90°. For example the angle α of the tapered trench 202 is between 100°-135°.

Figure 5:
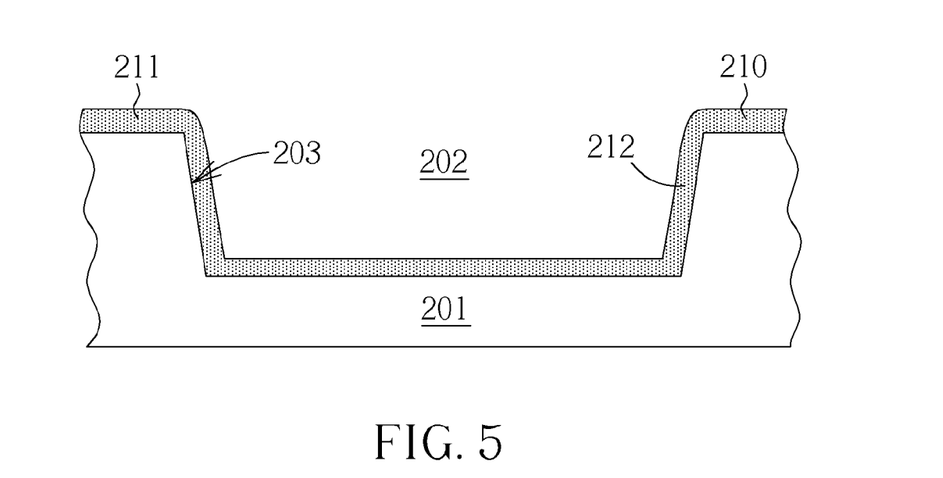

Second, as shown in FIG. 5, a first material layer 210 is used to conformally cover the substrate 201. The first material layer 210 may be a dielectric material, such as at least one of silicon oxide, silicon nitride, silicon oxynitride and silicon carbide. Or, the first material layer 210 may have a composite structure such as silicon oxide, silicon nitride, silicon oxynitride and/or silicon carbide made by respectively deposition and etching.

Figure 6:
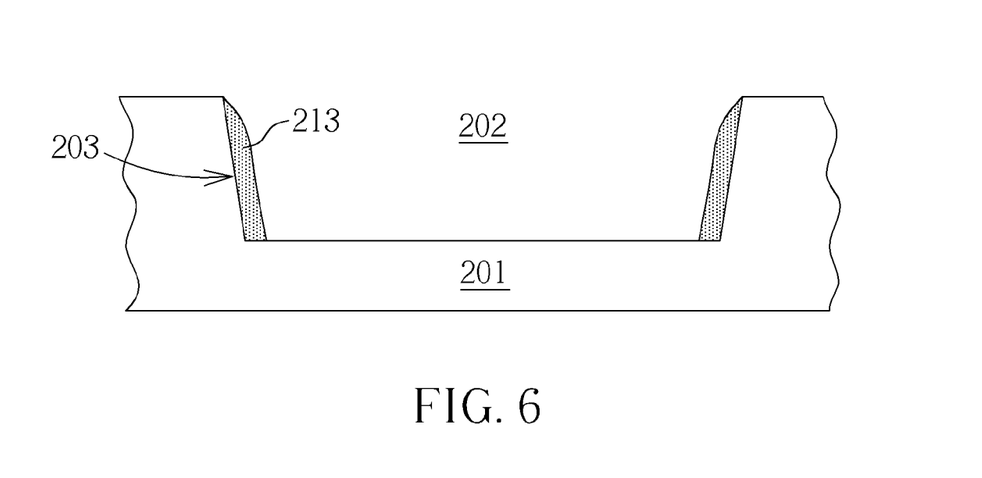

Then, please refer to FIG. 5 and FIG. 6 at the same time, a first etching step, such as a dry etching step, is performed. The first etching step preferably removes the horizontal part 211 of the first material layer 210 as much as possible but retains the vertical part 212, i.e. the first material layer 210 disposed on a sidewall 203 of the tapered trench 202, as much as possible, so the vertical part 212 of the first material layer 210 becomes a first spacer 213.

Figure 7:
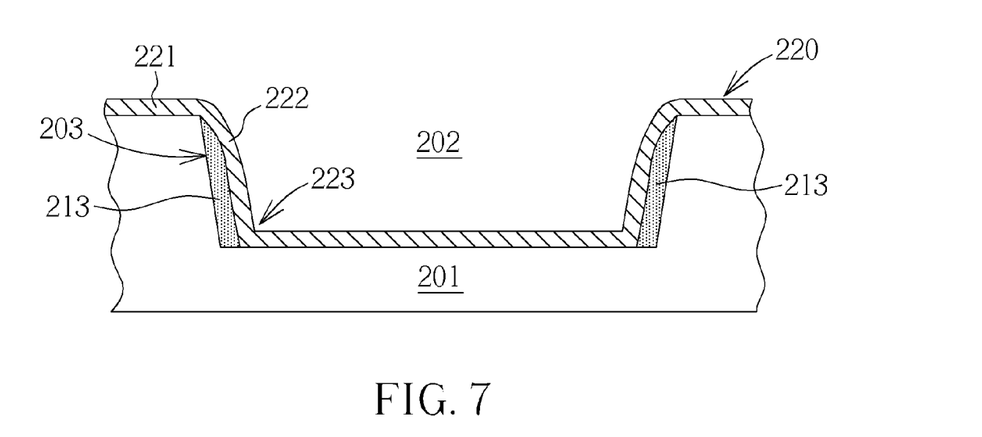

Later, as shown in FIG. 7, a first metal layer 220 is formed to conformally cover the substrate 201 and the first spacer 213. The first metal layer 220 may include at least one of Al, Ti, TiN, Ta and TaN. In addition, a suitable deposition, such as sputtering, may be used, along with the position of the first spacer 213 to make the horizontal part 221 of the first metal layer 220 as well as the vertical part 222 of the first metal layer 220 be able to conformally and uniformly cover the substrate 201 and the first spacer 213 as much as possible.

Although the thickness of the horizontal part 221 of the first metal layer 220 and the thickness of the vertical part 222 of the first metal layer 220 may be different, preferably, the thickness ratio of the horizontal part 221 of the first metal layer 220 and of the vertical part 222 of the first metal layer 220 may be in a range of 30%-70%. Due to the existence of the first spacer 213, the angle of the horizontal part 221 of the first metal layer 220 and the vertical part 222 of the first metal layer 220, i.e. the angle of the first metal layer 220 at the bottom of the tapered trench 202, is between 90°-135°. Besides, because of the existence of the first spacer 213 as well, the first metal layer 220 has corner rounding at the corner 223.

Figure 8:
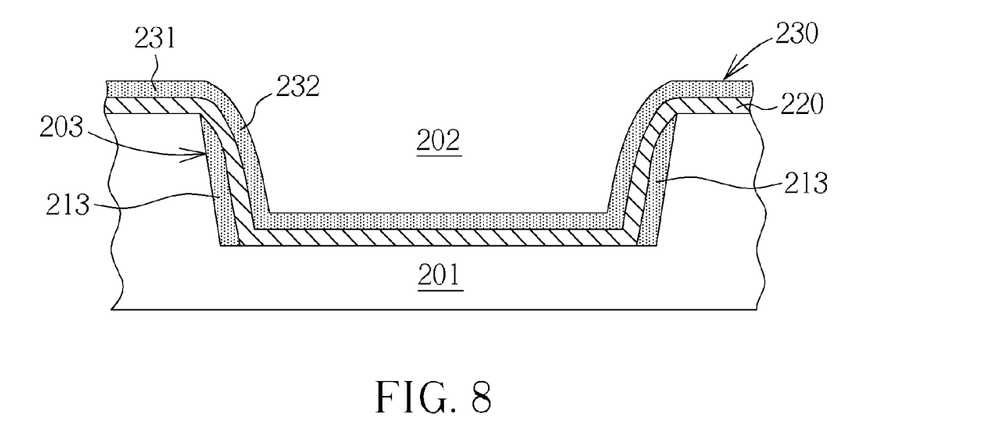

Next, as shown in FIG. 8, a second material layer 230 is formed to conformally cover the first metal layer 220. The second material layer 230 may be a dielectric material, such as at least one of silicon oxide, silicon nitride, silicon oxynitride and silicon carbide. Or, the second material layer 230 may have a composite structure such as silicon oxide, silicon nitride, silicon oxynitride and/or silicon carbide made by respectively deposition and etching.

Figure 9:
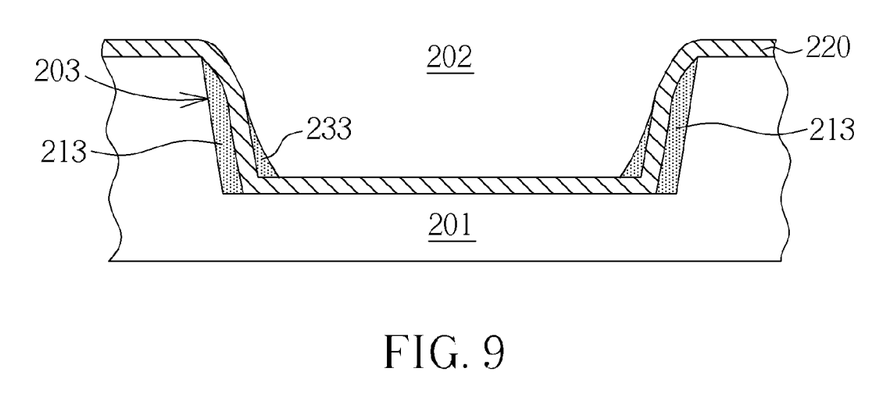

Then, please refer to FIG. 8 and FIG. 9 at the same time, a second etching step, such as a dry etching step, is performed. The second etching step still preferably removes the horizontal part 231 of the second material layer 230 as much as possible but retains the vertical part 232, i.e. the second material layer 230 disposed on a sidewall 203 of the tapered trench 202, as much as possible, so the vertical part 232 of the second material layer 230 becomes a second spacer 233.

Figure 10:
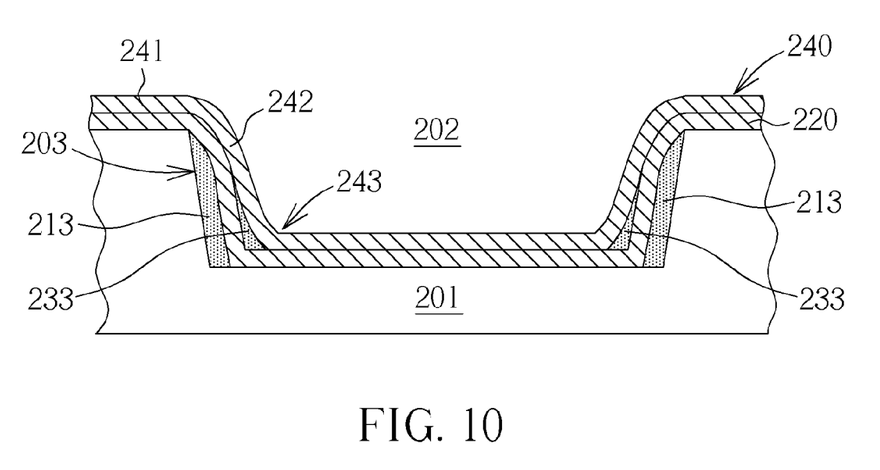

Thereafter, as shown in FIG. 10, a second metal layer 240 is formed to conformally cover the second spacer 233 and the first metal layer 220 so a 3D diaphragm electrode 250 is accordingly constructed. The second metal layer 240 may include at least one of Al, Ti, TiN, Ta and TaN. In addition, a suitable deposition, such as sputtering, may be used, along with the position of the second spacer 233 to make the horizontal part 241 of the second metal layer 240 as well as the vertical part 242 of the second metal layer 240 be able to conformally and uniformly cover the second spacer 233 and the first metal layer 220 as much as possible. Although the thickness of the horizontal part 241 of the second metal layer 240 and the thickness of the vertical part 242 of the second metal layer 240 may be different, however preferably, the thickness ratio of the horizontal part 241 of the second metal layer 240 and the vertical part 242 of the second metal layer 240 may be in the range of 30%-70%.

Due to the existence of the second spacer 233, the angle of the horizontal part 241 of the second metal layer 240 and the vertical part 242 of the second metal layer 240 is larger than the angle of the horizontal part 221 of the first metal layer 220 and the vertical part 222 of the first metal layer 220. That is, the angle of the second metal layer 240 at the bottom of the tapered trench 202 is larger, for example between 90°-135°. Besides, because of the existence of the second spacer 233 as well, the second metal layer 240 has corner rounding at the corner 243.

Figure 11:
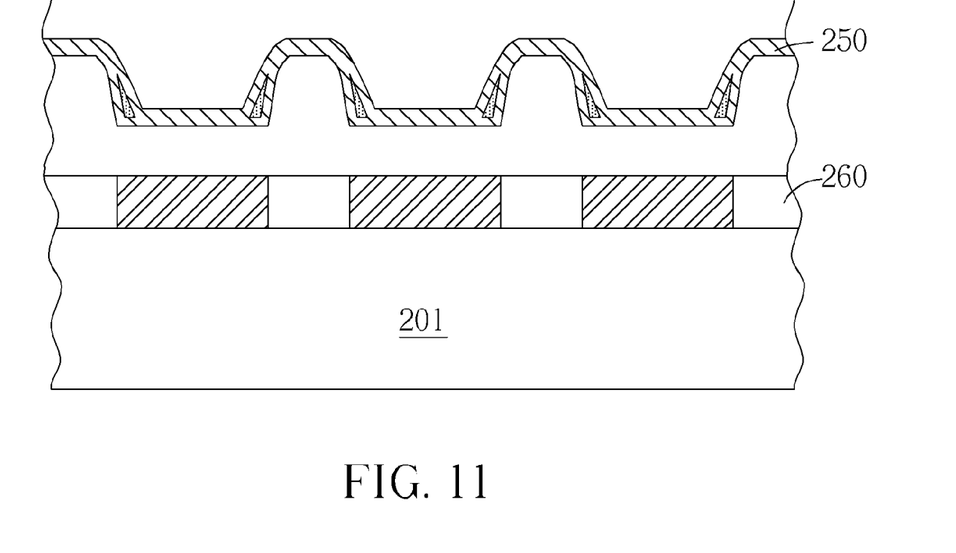
Figure 12:
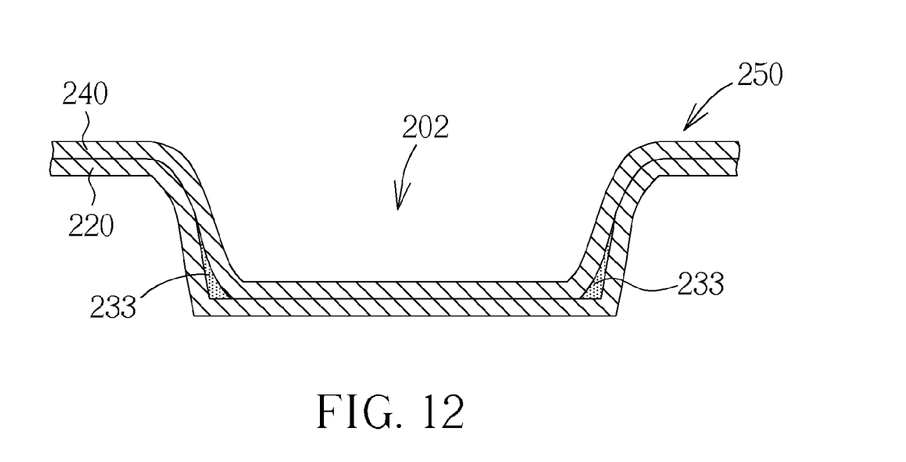

Furthermore, a backplate electrode 260 needs forming so that the backplate electrode 260 is adjacent to the 3D diaphragm electrode 250. Preferably, the backplate electrode 260 has a porous structure. Optionally, the backplate electrode 260 may be formed before the 3D diaphragm electrode 250 or after the 3D diaphragm electrode 250. As shown in FIG. 11, if the backplate electrode 260 is formed before the 3D diaphragm electrode 250, the backplate electrode 260 may be finished well before the formation of the trench 202 of the substrate 201. After the 3D diaphragm electrode 250 and the backplate electrode 260 are respectively finished, the substrate 201 in the corresponding region may be removed by back-etching step to form a back-chamber in the substrate 201. In such a way, the 3D diaphragm electrode 250 and the backplate electrode 260 together form a variable capacitor of a microphone structure 270. As shown in FIG. 12, the first spacer 213 for fine-tuning the angle of the first metal layer 220 may also be removed when the substrate 201 is removed.

Figure 13:
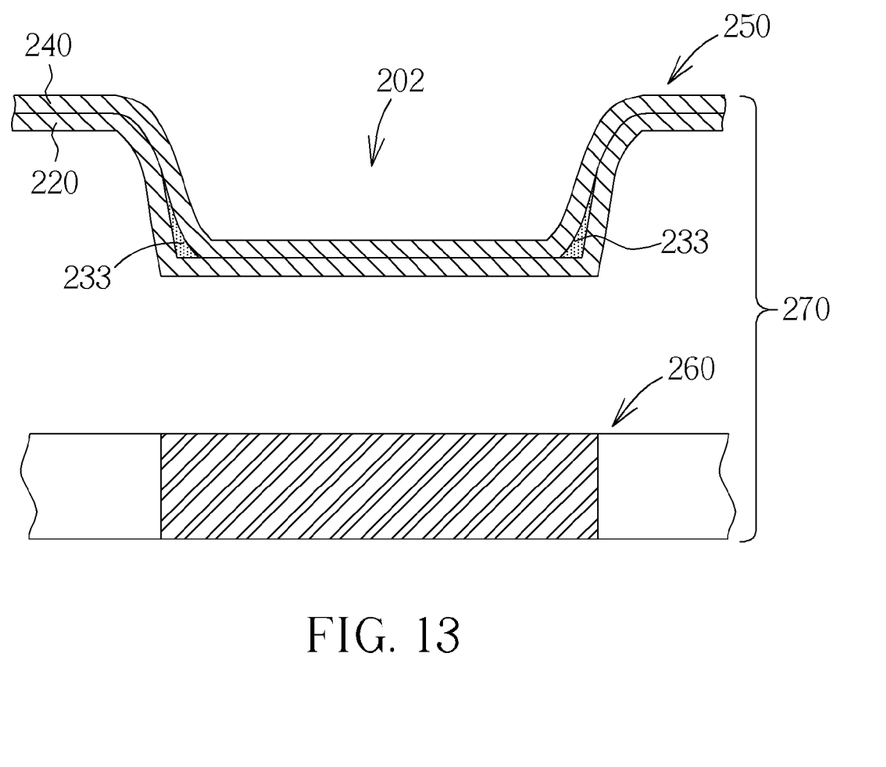
FIG. 13 illustrates an embodiment of the micro electro mechanical system structure of the present invention.

After the method of the present invention as described earlier, a micro electro mechanical system structure is obtained. FIG. 13 illustrates an embodiment of the micro electro mechanical system structure of the present invention. The micro electro mechanical system structure 270 of the present invention may be used as a microphone and includes a backplate electrode 260 and a 3D diaphragm electrode 250, a non-liner diaphragm electrode for example. The 3D diaphragm electrode 250 is adjacent to the backplate electrode 260, for example above the backplate electrode 260, to form a variable capacitor together. The backplate electrode 260 may have a porous structure.

The 3D diaphragm electrode 250 has a composite structure so that a dielectric is selectively disposed between two metal layers.

For example, the 3D diaphragm electrode 250 includes a first metal layer 220, at least a spacer 233 and a second metal layer 240. The first metal layer 220 has at least a concave trench structure 202. In addition, the spacer 233 is disposed on a sidewall 203 of the concave trench structure 202 so that the second metal layer 240 is conformally disposed on the surface of first metal layer 220 as well as on the spacer 233, and at the same time the spacer 233 is sandwiched between the first metal layer 220 and the second metal layer 240. The spacer 233 may be a dielectric material. One the other hand, the spacer 233 may have a composite structure. For example, the spacer 233 may include at least one of silicon oxide, silicon nitride, silicon oxynitride and silicon carbide.

As described earlier, the bottom and the sidewall of the concave trench structure 202 has an angle between 90°-135°, but the angles of the first metal layer 220 and of the second metal layer 240 on the bottom of the concave trench structure 202 are different. Besides, the thickness of the bottom of the concave trench structure 202 and the thickness of the sidewall of the concave trench structure 202 may be different. For example, the thickness ratio of the bottom of the concave trench structure 202 and of the sidewall of the concave trench structure 202 may be in the range of 30%-70%. The first metal layer 220 and the second metal layer 240 may respectively include at least one of Al, Ti, TiN, Ta and TaN.

In the micro electro mechanical system structure of the present invention, a dielectric is selectively disposed between two metal layers of the 3D diaphragm electrode to form a composite structure. The dielectric on one hand may fine-tune the structure of the composite structure, and on the other hand, the dielectric may also buffer the compressive or the tensile stress caused by sound waves when the microphone is in use so that the 3D diaphragm electrode of a composite structure may have higher robust mechanical strength. Moreover, the manufacturing process of the micro electro mechanical system structure of the present invention may involve no step to etch a metal layer so a simpler process can be obtained, which are two of the advantageous features of the present invention.

Those skilled in the art will readily observe that numerous modifications and alterations of the device and method may be made while retaining the teachings of the invention.

What is claimed is:

1. A micro electro mechanical system (MEMS) structure, comprising:
   a backplate electrode; and
   a 3D diaphragm electrode comprising:
      a first metal layer with at least a concave trench structure, wherein the thickness of the bottom of said concave trench structure and the thickness of the sidewall of said concave trench structure are different;
      at least a spacer formed at the sidewall of the concave trench structure; and
      a second metal layer conformally formed on and covering the surface of the first metal layer and the spacer.

2. A micro electro mechanical system (MEMS) structure of claim 1, wherein said backplate electrode has a porous structure.

3. A micro electro mechanical system (MEMS) structure of claim 1, wherein said 3D diaphragm electrode and said backplate electrode together form a variable capacitor together.

4. A micro electro mechanical system (MEMS) structure of claim 3, wherein the bottom and the sidewall of said concave trench structure has an angle between 90°-135°.

5. A micro electro mechanical system (MEMS) structure of claim 3, wherein said spacer has a composite structure.

6. A micro electro mechanical system (MEMS) structure of claim 3, wherein said first metal layer and said second metal layer respectively comprise at least one of Al, Ti, TiN, Ta and TaN.

7. A micro electro mechanical system (MEMS) structure of claim 3, wherein said spacer comprises at least one of silicon oxide, silicon nitride, silicon oxynitride and silicon carbide.

8. A micro electro mechanical system (MEMS) structure of claim 1, to form a microphone structure.

9. A micro electro mechanical system (MEMS) structure, comprising:
   a backplate electrode; and
   a 3D diaphragm electrode comprising:
      a first metal layer with at least a substantially U-shaped concave trench structure;
      at least a spacer formed at the sidewall of the concave trench structure; and
      a second metal layer conformally formed on and directly contacting the surface of the first metal layer and the spacer.

10. A micro electro mechanical system (MEMS) structure of claim 9, wherein said backplate electrode has a porous structure.

11. A micro electro mechanical system (MEMS) structure of claim 9, wherein said 3D diaphragm electrode and said backplate electrode together form a variable capacitor together.

12. A micro electro mechanical system (MEMS) structure of claim 9, wherein the bottom and the sidewall of said concave trench structure has an angle between 90°-135°.

13. A micro electro mechanical system (MEMS) structure of claim 9, wherein the thickness of the bottom of said concave trench structure and the thickness of the sidewall of said concave trench structure are different.

14. A micro electro mechanical system (MEMS) structure of claim 9, wherein said spacer has a composite structure.

15. A micro electro mechanical system (MEMS) structure of claim 9, wherein said first metal layer and said second metal layer respectively comprise at least one of Al, Ti, TiN, Ta and TaN.

16. A micro electro mechanical system (MEMS) structure of claim 9, wherein said spacer comprises at least one of silicon oxide, silicon nitride, silicon oxynitride and silicon carbide.

17. A micro electro mechanical system (MEMS) structure of claim 9, to form a microphone structure.

* * * * *